US011446529B2

(12) United States Patent
Ogier et al.

(10) Patent No.: US 11,446,529 B2
(45) Date of Patent: Sep. 20, 2022

(54) SYSTEMS AND METHODS OF FIRE SUPPRESSION SYSTEM CONFIGURATION

(71) Applicant: Tyco Fire Products LP, Lansdale, PA (US)

(72) Inventors: James Ogier, Ayer, MA (US); Shachak Zaarur, Brookline, MA (US)

(73) Assignee: Tyco Fire Products LP, Lansdale, PA (US)

( * ) Notice: Subject to any disclaimer, the term of this patent is extended or adjusted under 35 U.S.C. 154(b) by 308 days.

(21) Appl. No.: 16/875,634

(22) Filed: May 15, 2020

(65) Prior Publication Data

US 2020/0360751 A1 Nov. 19, 2020

Related U.S. Application Data

(60) Provisional application No. 62/849,408, filed on May 17, 2019.

(51) Int. Cl.
*A62C 37/36* (2006.01)
*G06F 30/20* (2020.01)
*G08B 17/00* (2006.01)

(52) U.S. Cl.
CPC .............. *A62C 37/36* (2013.01); *A62C 37/04* (2013.01); *G06F 30/20* (2020.01); *G08B 17/00* (2013.01)

(58) Field of Classification Search
None
See application file for complete search history.

(56) References Cited

U.S. PATENT DOCUMENTS 4,675,541 A * 6/1987 Peters .................... G08B 17/00
169/65
6,293,154 B1 * 9/2001 Kurtz ...................... G01L 19/02
73/727

(Continued)

FOREIGN PATENT DOCUMENTS

AU 2014318397 A1 * 4/2016 ......... A62C 99/0081
JP 4189996 B2 * 12/2008

OTHER PUBLICATIONS

Advanced Electronics Ltd, "User Manual PC-NeT-003", Aug. 17, 2005, http://www.masterfire.ie/fileupload/680-021-11%20Pc-NeT-003%20Manual.pdf, 66 pages.

(Continued)

*Primary Examiner* — Fekadeselassie Girma
(74) *Attorney, Agent, or Firm* — Foley & Lardner LLP

(57) ABSTRACT

A fire suppression configuration system includes a configurator. The configurator receives an indication of a plurality of components of a fire suppression system, an instruction to assign an input device of the fire suppression system to an input interface of a fire suppression system controller and at least one component, receive, an instruction to assign an output device to an output interface of the fire suppression system controller and at least one component, an indication of a connection between a first component and a second component, and an indication of at least one of a fire condition and supervisory condition corresponding to at least one input device, determines an output response of each output device by identifying each component that the output device is assigned and connected with, and executes a simulation using each output response corresponding to the at least one of the fire condition and supervisory condition.

20 Claims, 7 Drawing Sheets

(56) References Cited

U.S. PATENT DOCUMENTS

| | | | | |
|---|---|---|---|---|
| 8,752,640 | B1* | 6/2014 | Pottlitzer | G08B 25/003 169/56 |
| 10,271,766 | B1* | 4/2019 | Parker, Jr. | A61B 5/0836 |
| 10,984,151 | B1* | 4/2021 | Brown | G06T 17/05 |
| 2009/0259449 | A1* | 10/2009 | Franck | G06F 30/20 703/6 |
| 2011/0035199 | A1* | 2/2011 | Kristofik | G06F 30/20 703/6 |
| 2012/0156654 | A1* | 6/2012 | Bohlender | G09B 9/165 434/30 |
| 2014/0002800 | A1* | 1/2014 | Edwards | G02B 30/56 353/98 |
| 2015/0079559 | A1* | 3/2015 | Blackburn | G09B 19/00 434/226 |
| 2015/0242687 | A1* | 8/2015 | Seo | G06V 20/00 382/103 |
| 2016/0096051 | A1* | 4/2016 | Baker | A62C 37/36 169/46 |
| 2017/0326396 | A1* | 11/2017 | Pohl | A62C 37/44 |
| 2018/0350207 | A1* | 12/2018 | Yang | A62C 37/40 |
| 2020/0098241 | A1* | 3/2020 | Skaaksrud | B65D 90/06 |

OTHER PUBLICATIONS

AMPAC Advanced Warning Systems, "Loopsense Configuration Software", Dec. 5, 2012, https://ampac.net/wp-content/uploads/2017/03/MAN1571_LoopMaster_AS.pdf, 116 pages.

Electric Firestat, "24V PCU Core Fire Protection Installation Summary", Jun. 13, 2011, https://www.ventilationdirect.com/CatalogContent/PollutionControl/PCU/doc/PCU%20CORE%20Install%20Summary.pdf, 6 pages.

Fire-Lite Alarms, "PS-Tools User's Guide", Aug. 31, 2010, https://www.firelite.com/catalogDocuments/PSTools_9050_UserGuide.pdf, 102 pages.

Gent, "User Instructions: Mimic Configuration Tool for Mimic Panels", Aug. 31, 2008, http://gentexpert.co.uk/downloads/Addressable/Loop_Devices/A3_mimic/Mimic%20Config%20tool.pdf, 24 pages.

International Search Report and Written Opinion on International Application No. PCT/IB2020/054652, dated Sep. 2, 2020, 18 pages.

* cited by examiner

SYSTEMS AND METHODS OF FIRE SUPPRESSION SYSTEM CONFIGURATION

CROSS-REFERENCE TO RELATED APPLICATIONS

This application claims the benefit of and priority to U.S. Provisional Application No. 62/849,408, filed May 17, 2019, which is incorporated herein by reference in its entirety.

BACKGROUND

Fire suppression systems, such as for use in kitchens, can include a fire detector that detects a fire condition. The fire detector can provide a fire detection signal to a controller that causes a fire suppression agent to be distributed towards the fire, such as from an exhaust hood in the kitchen.

SUMMARY

At least one aspect relates to a fire suppression configuration system. The system includes one or more processors and memory including processor-executable instructions that when executed by the one or more processors, cause the one or more processors to receive, via a user interface, an indication of a plurality of components of a fire suppression system, receive, via the user interface, an instruction to assign an input device of the fire suppression system to an input interface of a fire suppression system controller of the fire suppression system and to at least one component of the plurality of components, receive, via the user interface, an instruction to assign an output device of the fire suppression system to an output interface of the fire suppression system controller and to at least one component of the plurality of components, receive, via the user interface, an indication of a connection between a first component of the plurality of components and a second component of the plurality of components, determine an output response of each output device by identifying each component that the output device is assigned to and each component that the output device is connected with based on the indication of the connection, receive an indication of at least one of a fire condition and a supervisory condition corresponding to at least one input device, execute a simulation by identifying each output response corresponding the at least one of the fire condition and the supervisory condition of the at least one input device, and present a representation of the simulation.

At least one aspect relates to a method of simulating a fire suppression system configuration. The method includes receiving, by one or more processors, an indication of a plurality of components of a fire suppression system, receiving, by the one or more processors, an instruction to assign an input device of the fire suppression system to an input interface of a fire suppression system controller of the fire suppression system and to at least one component of the plurality of components, receiving, by the one or more processors, an instruction to assign an output device of the fire suppression system to an output interface of the fire suppression system controller and to at least one component of the plurality of components, receiving, by the one or more processors, an indication of a connection between a first component of the plurality of components and a second component of the plurality of components, determining, by the one or more processors, an output response of each output device by identifying each component that the output device is assigned to and each component that the output device is connected with based on the indication of the connection, receiving, by the one or more processors, an indication of at least one of a fire condition and a supervisory condition corresponding to at least one input device, executing, by the one or more processors, a simulation by identifying each output response corresponding the at least one of the fire condition and the supervisory condition of the at least one input device, and outputting, by the one or more processors, a representation of the simulation.

At least one aspect relates to a controller for use in a fire suppression system. The controller includes one or more processors and memory. The memory comprises processor-executable instructions that when executed by the one or more processors, cause the one or more processors to receive, via a user interface, an indication of a plurality of components of the fire suppression system, receive, via the user interface, a connection path between the plurality of components of the fire suppression system, determine a hierarchy of the plurality of components of the fire suppression system, display the hierarchy of the plurality of components of the fire suppression system on the user interface, execute a simulation representative of a fire condition, and display the hierarchy and reaction of the plurality of components of the fire suppression system in response to the fire condition.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

The accompanying drawings are not intended to be drawn to scale. Like reference numbers and designations in the various drawings indicate like elements. For purposes of clarity, not every component can be labeled in every drawing. In the drawings.

DETAILED DESCRIPTION

Figure 1:
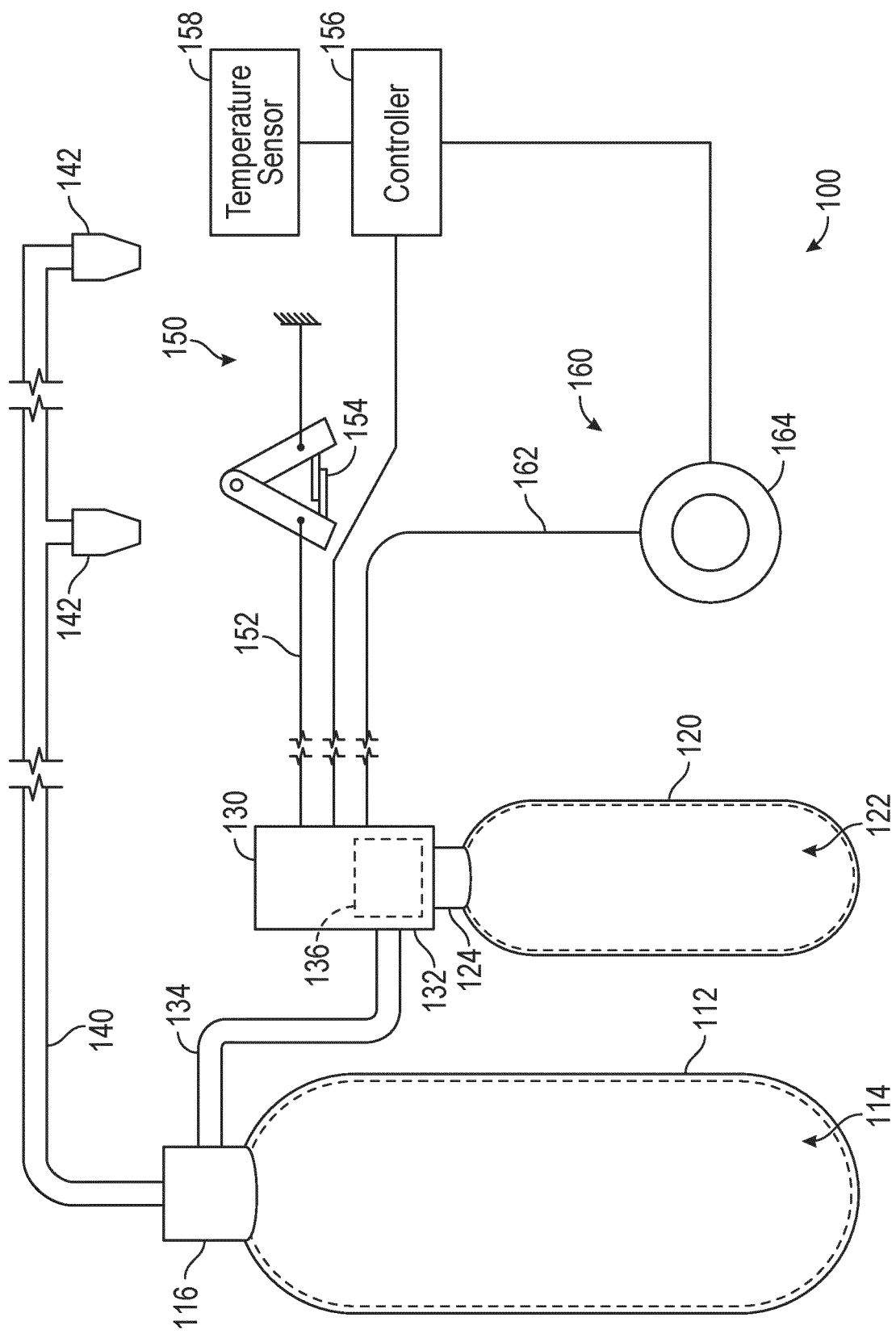
FIG. 1 is a block diagram of a fire suppression system.

Before turning to the figures, which illustrate certain embodiments in detail, it should be understood that the present disclosure is not limited to the details or methodology set forth in the description or illustrated in the figures. It should also be understood that the terminology used herein is for the purpose of description only and should not be regarded as limiting.

The present disclosure relates generally to the field of fire suppression, and to systems and methods of fire suppression system configuration. Fire suppression systems can output a fire suppression agent, such as a foam, to respond to a fire condition. Fire suppression systems can output the fire suppression agent responsive to detecting the fire condition. Fire suppression systems can be activated manually or automatically in response to an indication that a fire is present nearby (e.g., an increase in ambient temperature beyond a predetermined threshold value). For example, fire suppression systems can include a fire detector that detects the fire condition and provides a fire detection signal to a controller. The controller can cause the fire suppression agent to be delivered from a storage tank towards the fire, such as through one or more nozzles. The fire suppression system can spread the fire suppression agent through an area, to extinguish the fire or prevent growth of the fire. The fire suppression system can be used to protect a variety of devices, such as areas associated with ventilating equipment including hoods, ducts, plenums, and filters. The fire suppression systems can be used to protect auxiliary grease extraction equipment and cooking equipment, such as fryers; griddles and range tops; upright, natural charcoal, or chain-type broilers; electric, lava rock, mesquite, or gasradiant char-broilers; and woks.

Configuring fire suppression systems for operation can include connecting various electronics components, such as detectors, pull stations, valve relays, switches, and alarms, to a controller. However, this can be an error-prone process, as the system behavior may not be apparent from the connections that are made. For example, if a pull station is connected to the wrong terminal of the controller, the fire suppression agent may not discharge responsive to activation of the pull station, or the wrong fire suppression agent may discharge. As compared to some fire suppression systems, such as mechanical suppression systems that rely on melting of tension wires to actuate fire suppression agent delivery, electronic fire suppression systems can have complex networks and hierarchies of components, which may increase the likelihood of errors occurring during configuration. Moreover, testing the fire suppression system during configuration may not be feasible, as it may require having a real fire source and discharging the fire suppression agent to confirm proper configuration.

The present solution can use a configurator that simulates system behavior by automatically calculating relationships between components that are connected to the controller and the resulting responses of the components under various conditions. For example, a fire suppression configuration system can include a configurator that can receive, via a user interface, an indication of a plurality of components of a fire suppression system, receive, via the user interface, an instruction to assign an input device of the fire suppression system to an input interface of a fire suppression system controller of the fire suppression system and to at least one component of the plurality of components, receive, via the user interface, an instruction to assign an output device of the fire suppression system to an output interface of the fire suppression system controller and to at least one component of the plurality of components, receive, via the user interface, an indication of a connection between a first component of the plurality of components and a second component of the plurality of components, determine an output response of each output device by identifying each component that the output device is assigned to and each component that the output device is connected with based on the indication of the connection, receive an indication of at least one of a fire condition and a supervisory condition corresponding to at least one input device, execute a simulation by identifying each output response corresponding the at least one of the fire condition and the supervisory condition of the at least one input device, and present a representation of the simulation.

Referring to FIG. 1, among others, a fire suppression system 100 is depicted. The fire suppression system 100 can be a chemical fire suppression system. The fire suppression system 100 can distribute a fire suppressant agent onto or nearby a fire, extinguishing the fire and preventing the fire from spreading. The fire suppression system 100 can be used alone or in combination with other types of fire suppression systems (e.g., a building sprinkler system, a handheld fire extinguisher). Multiple fire suppression systems 100 can be used in combination with one another to cover a larger area (e.g., each in different rooms of a building).

The fire suppression system 100 can be used in a variety of applications. The fire suppression system 100 can be used with a variety of fire suppressant agents, such as powders, liquids, foams, or other fluid or flowable materials. The fire suppression system 100 can be used in a variety of stationary applications. For example, the fire suppression system 100 can be used in kitchens (e.g., for oil or grease fires), in libraries, in data centers (e.g., for electronics fires), at filling stations (e.g., for gasoline or propane fires), or in other stationary applications. The fire suppression system 100 can be used in a variety of mobile applications. For example, the fire suppression system 100 can be incorporated into land-based vehicles (e.g., racing vehicles, forestry vehicles, construction vehicles, agricultural vehicles, mining vehicles, passenger vehicles, refuse vehicles), airborne vehicles (e.g., jets, planes, helicopters), or aquatic vehicles, (e.g., ships, submarines).

The fire suppression system 100 can include at least one fire suppressant tank 112. The fire suppression tank 112 can be a vessel, container, vat, drum, canister, cartridge, or can. The fire suppressant tank 112 can define an internal volume 114 filled (e.g., partially filled, completely filled) with fire suppressant agent. The fire suppressant agent may be below a pressurized level of pressure, such as by being at or near atmospheric pressure.

Water can be used as the fire suppression agent. Water can be effective at extinguishing fires fueled by common flammable materials such as wood, paper, and cloth. When attempting to extinguish certain types of fires, such as oil or grease fires, water can cause the fire to spread instead of suppressing it. When extinguishing fire near certain types of objects, such as books or electronic components, exposure to water can damage the objects that the fire suppression system is designed to protect. In such scenarios, application-specific chemicals can be used as the fire suppressant agent.

The fire suppressant tank 112 can include a neck 116. The neck 116 permits flow of expellant gas into the internal volume 114 and the flow of fire suppressant agent out of the internal volume 114 so that the fire suppressant agent can be supplied to a fire.

The fire suppression system 110 can include at least one cartridge 120. The cartridge 120 can be a vessel, container, vat, drum, tank, canister, or can. The cartridge 120 defines an internal volume 122 in which there is pressurized expellant gas. The expellant gas can be an inert gas. The expellant gas can be air, carbon dioxide, or nitrogen. The cartridge 120 can include a neck 124. The neck 124 defines an outlet fluidly coupled with the internal volume 122. Accordingly, the expellant gas can leave the cartridge 120 through the neck 124. The cartridge 120 can be rechargeable or disposable after use. Where the cartridge 120 is rechargeable, additional expellant gas can be supplied to the internal volume 122 through the neck 124.

The fire suppression system 110 can include at least one actuator 130. The actuator 130 can include a valve, puncture device, or activator assembly. The actuator 130 can include a receiver 132 that receives the neck 124 of the cartridge 120. The neck 124 can be selectively coupled with the receiver 132 (e.g., through a threaded connection). Decoupling the cartridge 120 from the actuator 130 facilitates removal and replacement of the cartridge 120 when the cartridge 120 is depleted. The actuator 130 can be fluidly coupled with the neck 116 of the fire suppressant tank 112 through a conduit or pipe, such as hose 134. The actuator 130 can be implemented using a protacting actuation device (PAD).

The actuator 130 can include an activator 136 that can fluidly couple the internal volume 122 with the neck 116. The activator 136 can include one or more valves that selectively fluidly couple the internal volume 122 with the hose 134. The valves can be mechanically, electrically, manually, or otherwise actuated. The neck 124 can include a valve that selectively prevents the expellant gas from flowing through the neck 124. Such a valve can be manually operated (e.g., by a lever or knob on the outside of the cartridge 120) or can open automatically responsive to engagement of the neck 124 with the actuator 130. Such a valve facilitates removal of the cartridge 120 prior to depletion of the expellant gas.

The cartridge 120 may be sealed, and the activator 136 can include a pin, knife, nail, or other sharp object that the actuator 130 forces into contact with the cartridge 120. The actuator 130 can thus cause the activator 136 to puncture the outer surface of the cartridge 120, fluidly coupling the internal volume 122 with the actuator 130. The activator 136 can puncture the cartridge 120 only when the actuator 130 is activated. The activator 136 may not use valves that control the flow of expellant gas to the hose 134 when the activator 136 operates by puncturing the cartridge 120. The activator 136 may automatically puncture the cartridge 120 responsive to the neck 124 engaging the actuator 130.

Once the actuator 130 is activated and the cartridge 120 is fluidly coupled to the hose 134, the expellant gas from the cartridge 120 can flow freely through the neck 124, the actuator 130, and the hose 134 and into the neck 116 of the fire suppressant tank 112. The expellant gas forces fire suppressant agent from the fire suppressant tank 112 out through the neck 116 and into pipe 140. The neck 116 can direct the expellant gas from the hose 134 to a top portion of the internal volume 114. The neck 116 can define an outlet (e.g., using a siphon tube) near the bottom of the fire suppressant tank 112. The pressure of the expellant gas at the top of the internal volume 114 can force the fire suppressant agent to exit through the outlet and into the pipe 140.

The expellant gas may enter a bladder within the fire suppressant tank 112, and the bladder can press against the fire suppressant agent to force the fire suppressant agent out through the neck 116. The pipe 140 and the hose 134 can be coupled with the fire suppressant tank 112 at different locations. By way of example, the hose 134 can be coupled with the top of the fire suppressant tank 112, and the pipe 140 can be coupled with the bottom of the fire suppressant tank 112.

The fire suppressant tank 112 can include a burst disk that prevents the fire suppressant agent from flowing out through the neck 116 until the pressure within the internal volume 114 exceeds a threshold pressure. Once the pressure exceeds the threshold pressure, the burst disk ruptures, permitting the flow of fire suppressant agent.

The fire suppressant tank 112 can include a valve, a puncture device, or another type of opening device or activator assembly that fluidly couples the internal volume 114 with the pipe 140 in response to the pressure within the internal volume 114 exceeding the threshold pressure. Such an opening device can activate mechanically (e.g., the force of the pressure causes the opening device to activate) or the opening device may include a separate pressure sensor in communication with the internal volume 114 that causes the opening device to activate.

The pipe 140 can be fluidly coupled with one or more outlets or sprayers, such as nozzles 142. The fire suppressant agent flows through the pipe 140 and to the nozzles 142. The nozzles 142 each define one or more apertures, through which the fire suppressant agent exits, forming a spray of fire suppressant agent that covers a desired area. The sprays from the nozzles 142 then suppress or extinguish fire within that area. The apertures of the nozzles 142 can be shaped to control the spray pattern of the fire suppressant agent leaving the nozzles 142. The nozzles 142 can be aimed such that the sprays cover specific points of interest (e.g., a specific piece of restaurant equipment, a specific component within an engine compartment of a vehicle). The nozzles 142 can all activate simultaneously, or nozzles 142 in proximity to the fire can be activated.

The fire suppression system 110 can include an automatic activation system 150 that controls the activation of the actuator 130. The automatic activation system 150 can monitor one or more conditions and determine if those conditions are indicative of a nearby fire. Responsive to detecting a fire, the automatic activation system 150 activates the actuator 130, causing the fire suppressant agent to be driven out of the nozzles 142 and extinguish the fire. Various devices and components described herein, such as the automatic activation system 150, can communicate via protocols used for transmitting data in noisy, industrial environments, including but not limited to the RS485 protocol.

The actuator 130 can be controlled mechanically. As depicted in FIG. 1, the automatic activation system 150 can include a mechanical system including a tensile member 152 (e.g., a rope, a cable) that imparts a tensile force on the actuator 130. Without this tensile force, the actuator 130 will activate. The cable 152 can be coupled with a fusible link 154, which is in turn coupled with a stationary object (e.g., a wall, the ground). The fusible link 154 can undergo a state change responsive to a temperature exceeding a threshold temperature, which can release the tension on the cable 152. For example, the fusible link 154 can include two plates that are held together with a solder alloy having a predetermined melting point. A first plate can be coupled with the cable 152, and a second plate can be coupled with the stationary object. When the ambient temperature surrounding the fusible link 154 exceeds the melting point of the solder alloy, the solder can melt, allowing the two plates to separate. This can release the tension on the cable 152, causing the actuator 130 to activate.

The automatic activation system 150 may include a mechanical system that imparts a force on the actuator 130 to activate the actuator 130, such as by using linkages, motors, hydraulic or pneumatic components (e.g., pumps, compressors, valves, cylinders, hoses), or other types of mechanical components to activate the actuator 130. Some parts of the automatic activation system 150 (e.g., a compressor, hoses, valves, and other pneumatic components) can be shared with other parts of the fire suppression system 100 (e.g., the manual activation system 160) or vice versa.

The actuator 130 can activate in response to receiving an electrical signal from the automatic activation system 150. The automatic activation system 150 can include at least one controller 156 that monitors signals from one or more sensors, such as at least one temperature sensor 158. The temperature sensor 158 can include a thermocouple, resistance temperature detector, or a thermistor. The controller 156 can use the signals from the temperature sensor 158 to determine if an ambient temperature has exceeded a threshold temperature. Responsive to determining that the ambient temperature has exceeded the threshold temperature, the controller 156 can provide an electrical signal (e.g., fire detection signal) to the actuator 130 to cause the actuator 130 to activate responsive to receiving the electrical signal.

The manual activation system 160 can control the activation of the actuator 130. The manual activation system 160 can activate the actuator 130 in response to an input from an operator. The manual activation system 160 can be included instead of or in addition to the automatic activation system 150. Both the automatic activation system 150 and the manual activation system 160 can activate the actuator 130 independently. For example, the automatic activation system 150 can activate the actuator 130 regardless of any input from the manual activation system 160, and vice versa.

As depicted in FIG. 1, the manual activation system 160 includes a mechanical system including a tensile member, such as cable 162, coupled with the actuator 130. The cable 162 is coupled with an interface element 164, such as a button, a lever, a switch, a knob, a pull station, or a pull ring. The interface element 164 can impart a tensile force on the cable 162 when pressed, and this tensile force can be transferred to the actuator 130. The actuator 130 activates responsive to the tensile force. The manual activation system 160 can include linkages, motors, hydraulic or pneumatic components (e.g., pumps, compressors, valves, cylinders, hoses, etc.), or other types of mechanical components configured to activate the actuator 130.

The actuator 130 can activate in response to receiving an electrical signal from the manual activation system 160. As depicted in FIG. 1, the interface element 164 can be operably coupled with the controller 156. The controller 156 can monitor the status of the interface element 164 (e.g., engaged, disengaged). Responsive to determining that the interface element 164 is engaged, the controller 156 can provide an electrical signal to activate the actuator 130. For example, the controller 156 can monitor a signal from the interface element 164 to determine if the button 164 is pressed. Responsive to detecting that the button 164 has been pressed, the controller 156 can send an electrical signal to the actuator 130 to activate the actuator 130.

The automatic activation system 150 and the manual activation system 160 can activate the actuator 130 both mechanically (e.g., though application of a tensile force through cables, through application of a pressurized liquid, through application of a pressurized gas) and electrically (e.g., by providing an electrical signal). The automatic activation system 150 or the manual activation system 160 can be configured to activate the actuator 130 solely mechanically, solely electrically, or through some combination of both. For example, the automatic activation system 150 can omit the controller 156 and activate the actuator 130 based on the input from the fusible link 154. The automatic activation system 150 can omit the fusible link 154 and activate the actuator 130 using an input from the controller 156.

Figure 2:
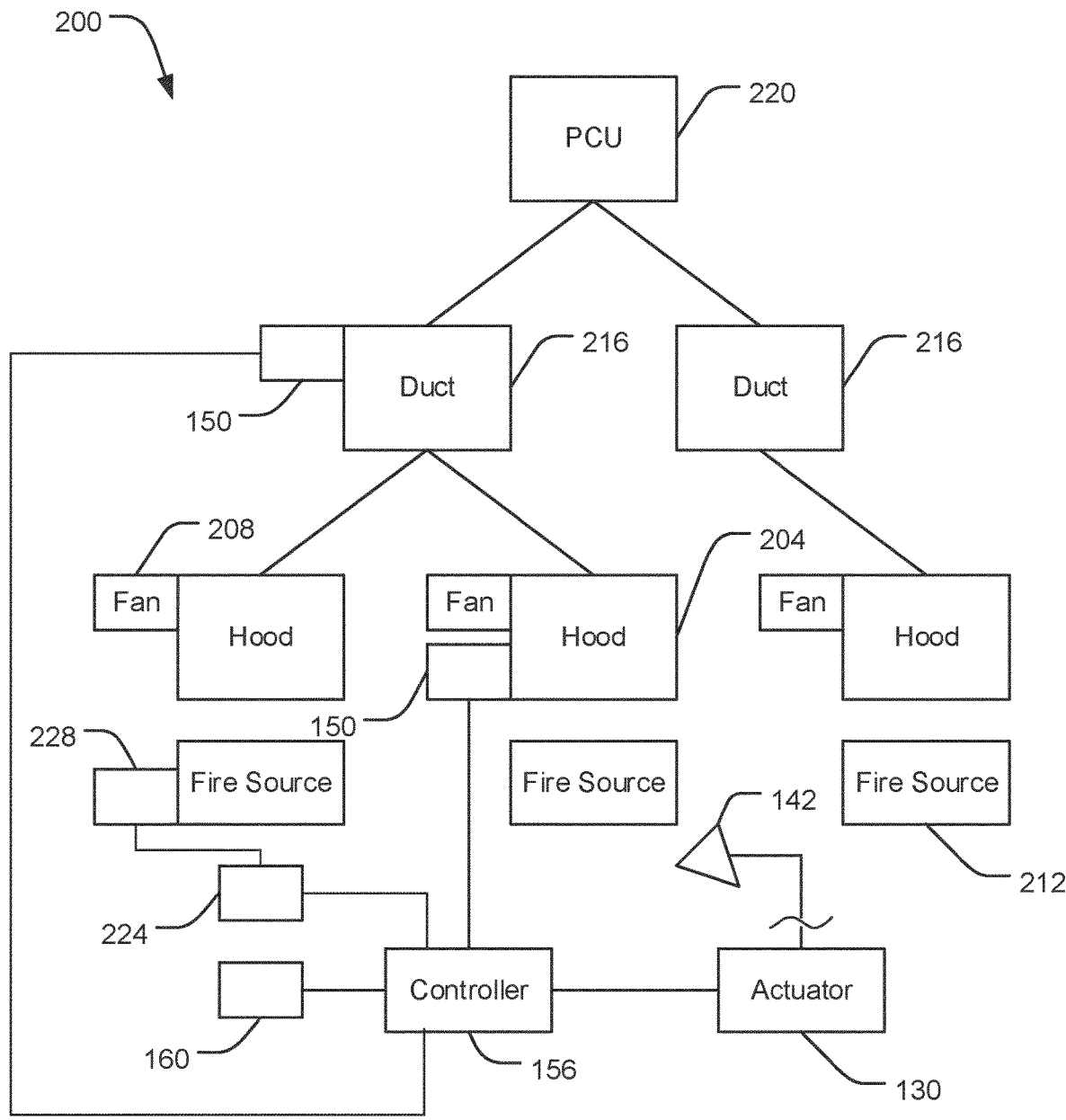
FIG. 2 is a block diagram of a hierarchy of a fire suppression system in a fire suppression environment.

Referring to FIG. 2, a system 200 is depicted. The system 200 can incorporate features of the fire suppression system 100, such as the actuator 130, automatic activation system 150, controller 156, and manual activation system 160, to protect various aspects of the system 200.

The system 200 includes at least one hood 204. The 204 may be a kitchen exhaust hood. The hood 204 may be coupled with at least one fan 208 that causes air to flow into the at least one hood 204 from an area around the at least one hood 204. Each hood 204 can be in proximity to one or more fire sources 212, such as range tops.

Each hood 204 can be coupled with at least one duct 216. The duct 216 can receive air from the hood(s) 204 with which the duct 216 is coupled. For example, the duct 216 can receive air driven by the fan 208 from the hood 204 into the duct 216.

The system 200 can include at least one pollution control unit (PCU) 220. Each duct 216 can be coupled with a corresponding PCU 220. The PCU 220 can be mounted within the at least one duct 216 or at an end of the at least one duct 216 (e.g., on a roof of a building in which the at least one duct 216 is provided). The PCU 220 can filter the air received from the hoods 204 via the at least one duct 216. For example, the PCU 220 can include at least one of a baffle filter, a panel filter, a high efficiency particulate air (HEPA) filter, a bag filter, a charcoal filter, and an electrostatic precipitator.

Various detection input devices (e.g., automatic activation system 150, manual activation system 160) and corresponding output devices (e.g., relays, actuators 130) can operate responsive to conditions of the at least one hood 204, at least one duct 216, and PCU 220. For example, the system 200 can include at least one automatic activation system 150. As depicted in FIG. 2, the automatic activation system 150 is coupled with the hood 204, so that the automatic activation system 150 can detect a fire condition of the hood 204 and output an indication of the fire condition, such as by transmitting the indication to the controller 156.

Responsive to receiving the indication, the controller 156 can cause the actuator 130 to cause fire suppression agent to be outputted from the nozzle 142 to address the fire source 212. The manual activation system 160 can also cause operation of the actuator 130.

The controller 156 can cause at least one relay 224 to switch or activate responsive receiving the indication of the fire condition from the automatic activation system 150 or the manual activation system 160. For example, FIG. 2 depicts the relay 224 coupled with a gas valve 228 that provides gas to the fire source 212. The controller 156 can cause the relay 224 to switch the gas valve 228 off responsive to receiving the indication of the fire condition. The gas valve 228 may be a manual valve that remains off until manually reset.

The relay 224 can be coupled with various devices, such as make-up air supplies, electricity sources, and alarms, and the controller 156 can use the relay 224 to control operation of such devices responsive to receiving the indication of the fire condition. The relay 224 may be coupled with a building fire alarm panel to provide a signal to the building fire alarm panel indicating the fire condition.

As depicted in FIG. 2, the components of the system 200 can be arranged in a hierarchy of layers, from a first layer (e.g., bottom layer) of the at least one hood 204, to a second layer of the at least one duct 216, to a third layer (e.g., top layer) of the PCU 220. The hierarchy can represent functional relationships between the components of the system, such as to determine whether specific actuators or relays should activate responsive to fire conditions or other conditions being detected. The system 200 may include multiple controllers 156 each assigned to one or more layers or components thereof; for example, the controller 156 can include a plurality of independent control units that can each control operation of a respective actuator 130 or relay 224. Each hood 204 may be separately assigned each of a corresponding actuator 130, automatic activation system 150, manual activation system 160, gas valve shutdown relay 224, and electricity shutdown relay 224.

Figure 3:
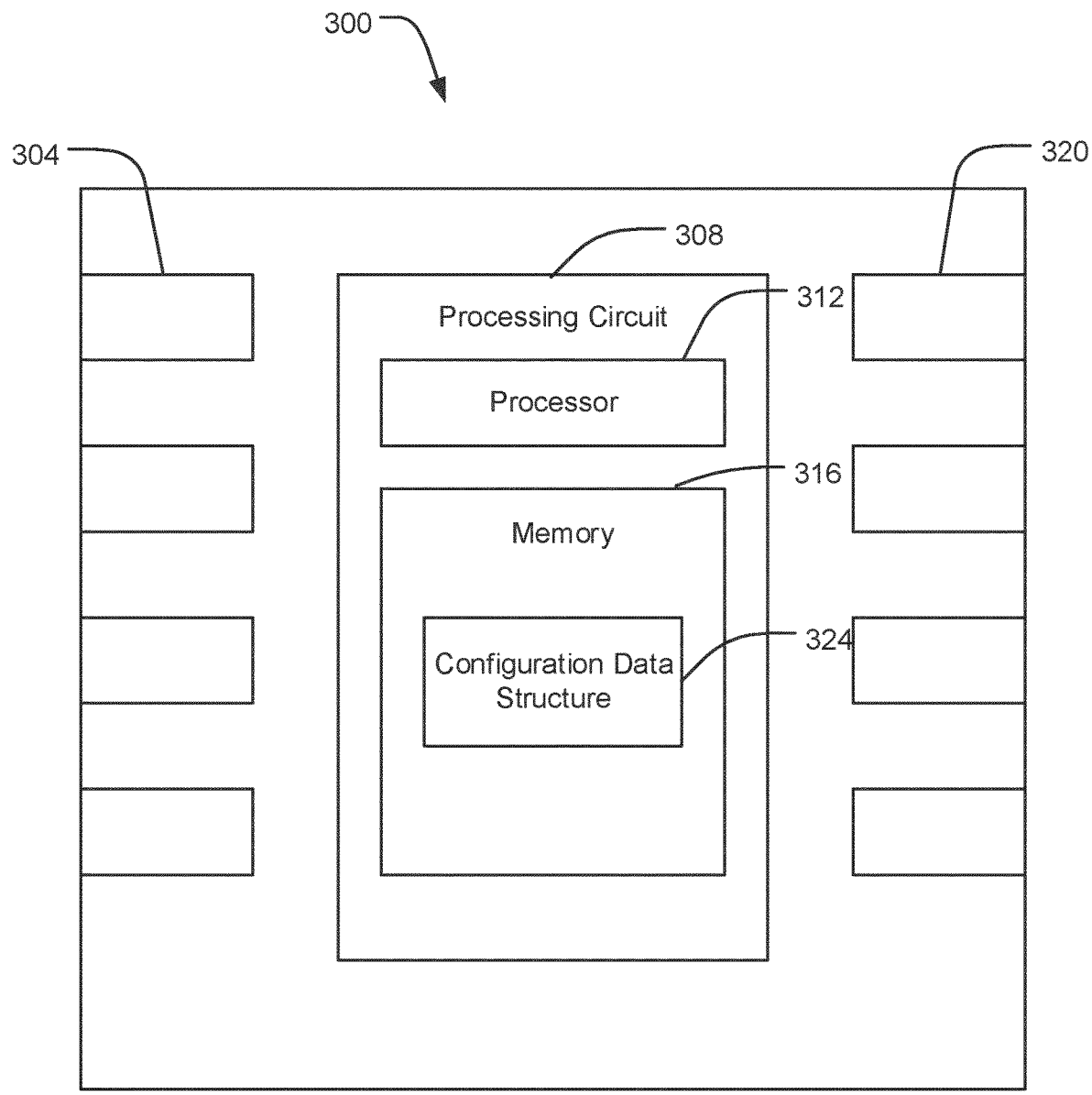
FIG. 3 is a block diagram of a controller of a fire suppression system.

Referring to FIG. 3, a controller 300 is depicted. The controller 300 can be used to implement the controller 156 described with reference to FIGS. 1 and 2, such as to receive signals from the automatic activation system 150 or manual activation system 160 and control operation of actuators 130 and relays 224 based on the received signals. The controller 300 can include a plurality of input interfaces 304, a processing circuit 308, and a plurality of output interfaces 320.

The processing circuit 308 can include a processor 312 and memory 316. The processor 312 can be implemented as a specific purpose processor, an application specific integrated circuit (ASIC), one or more field programmable gate arrays (FPGAs), a group of processing components, or other suitable electronic processing components. The processor 312 can be a distributed computing system or a multi-core processor. The memory 316 is one or more devices (e.g., RAM, ROM, flash memory, hard disk storage) for storing data and computer code for completing and facilitating the various user or client processes, layers, and modules described in the present disclosure. The memory 316 can be or include volatile memory or non-volatile memory and can include database components, object code components, script components, or any other type of information structure for supporting the various activities and information structures of the concepts disclosed herein. The memory 316 is communicably connected to the processor 312 and includes computer code or instruction modules for executing one or more processes described herein. The memory 316 can include various circuits, software engines, and/or modules that cause the processor to execute the systems and methods described herein. The memory can be distributed across disparate devices.

The plurality of input interfaces 304 can include wired, physical, or electronic connections to allow input devices, such as input connections from the automatic activation system 150 and the manual activation system 160, to connect with the processing circuit 308. The plurality of output interfaces 320 can include wired, physical, or electronic connections to allow output devices, such as output connections to actuators 130 and relays 224, to receive control signals from the processing circuit 308.

The processing circuit 308 can receive a detection signal via the plurality of input interfaces 304, process the detection signal, and provide a control signal via the plurality of output interfaces 320 based on processing the detection signal. The processing circuit 308 can determine that the detection signal indicates a fire condition. For example, the processing circuit 308 can determine the detection signal to indicate the fire condition responsive to receiving the detection signal from the automatic activation system 150. The processing circuit 308 can determine the detection signal to indicate the fire condition by extracting a temperature from the detection signal (e.g., if the detection signal is received from the temperature sensor 158), comparing the temperature to a threshold temperature indicative of the fire condition, and determining the temperature to exceed the threshold temperature.

The processing circuit 308 can determine that the detection signal indicates a supervisory condition. For example, the processing circuit 308 can determine that the detection signal indicates the supervisory condition responsive to receiving the detection signal from a detector such as a linear detection device, a spot thermal detection device, or a pull station.

The processing circuit 308 can generate control signals from controlling operation of actuators 130 and relays 224 based on determining that the detection signal indicates the fire condition or the supervisory condition. For example, responsive to determining the detection signal to indicate the fire condition, the processing circuit 308 can generate the control signal to cause at least one of an electricity relay 224 to shut off electricity, a make-up air relay 224 to shut off a make-up air supply, a gas valve relay 224 to shut off gas, and an alarm relay 224 to turn on to output an alarm (and, if applicable, initiate an alarm condition in a building fire alarm panel). Responsive to determining the detection signal to indicate the supervisory condition, the processing circuit 308 can generate the control signal to cause at least one of an electricity relay to shut off electricity, a make-up relay 224 to shut off a make-up air supply, and a gas valve relay 224 to shut off gas.

The processing circuit 308 can maintain a configuration data structure 324. The configuration data structure 324 can indicate relationships between components of the system 200. For example, the configuration data structure 324 can maintain associations between each hood 204 and the corresponding actuator 130, automatic activation system 150, manual activation system 160, gas valve shutdown relay 224, and electricity shutdown relay 224 assigned to each hood 204. The processing circuit 308 can generate each association based on the components being connected to the processing circuit 308 via the input interfaces 304 or output interfaces 320, or based on receiving instructions indicating the associations.

As described above, the components of the system 200 can be arranged in a hierarchy. Based on the hierarchy, each component that is below and connected with a particular component in the hierarchy can be caused to respond in a manner analogous to the particular component. For example, as depicted in FIG. 2, two of the hoods 204 are connected with and below one of the ducts 216, the third hood 204 is connected with and below the other duct 216, and each of the components are connected with and below the PCU 220. The processing circuit 308 can generate associations amongst the components of the system 200 based on these relationships of the hierarchy and maintain the associations in the configuration data structure 324.

The processing circuit 308 can generate control signals that automatically control operation of components based on the associations maintained in the configuration data structure 324, including the associations generated based on the hierarchy. For example, responsive to detecting the fire condition is received from the automatic activation system 150 assigned to the duct 216, the processing circuit 308 can generate the control signal based on the fire condition and transmit the control signal to each hood 204 connected with and below the duct 216 and component assigned to the hoods 204 that are connected with and below the duct 216. FIG. 2 depicts the automatic activation system 150 coupled with the duct 216 as being in communication with the same controller 156 as the automatic activation system 150 associated with the hood 204; as discussed above, the system 200 may include a separate controller 156 assigned to the ducts 216 that receives the fire detection signal from the automatic activation system 160 associated with the ducts 216. In some embodiments, each hazard (e.g., hoods 204, ducts 216, PCU 220) is assigned a single, independent controller 300. The controllers 300 may communicate with one another, such as to communicate inputs regarding each hazard. In some embodiments, if the controller 300 assigned to a particular hazard is in a non-operational state (e.g., disconnected), other controllers 300 can determine that the inputs for the particular hazard are in a fire condition or supervisory condition.

Figure 4:
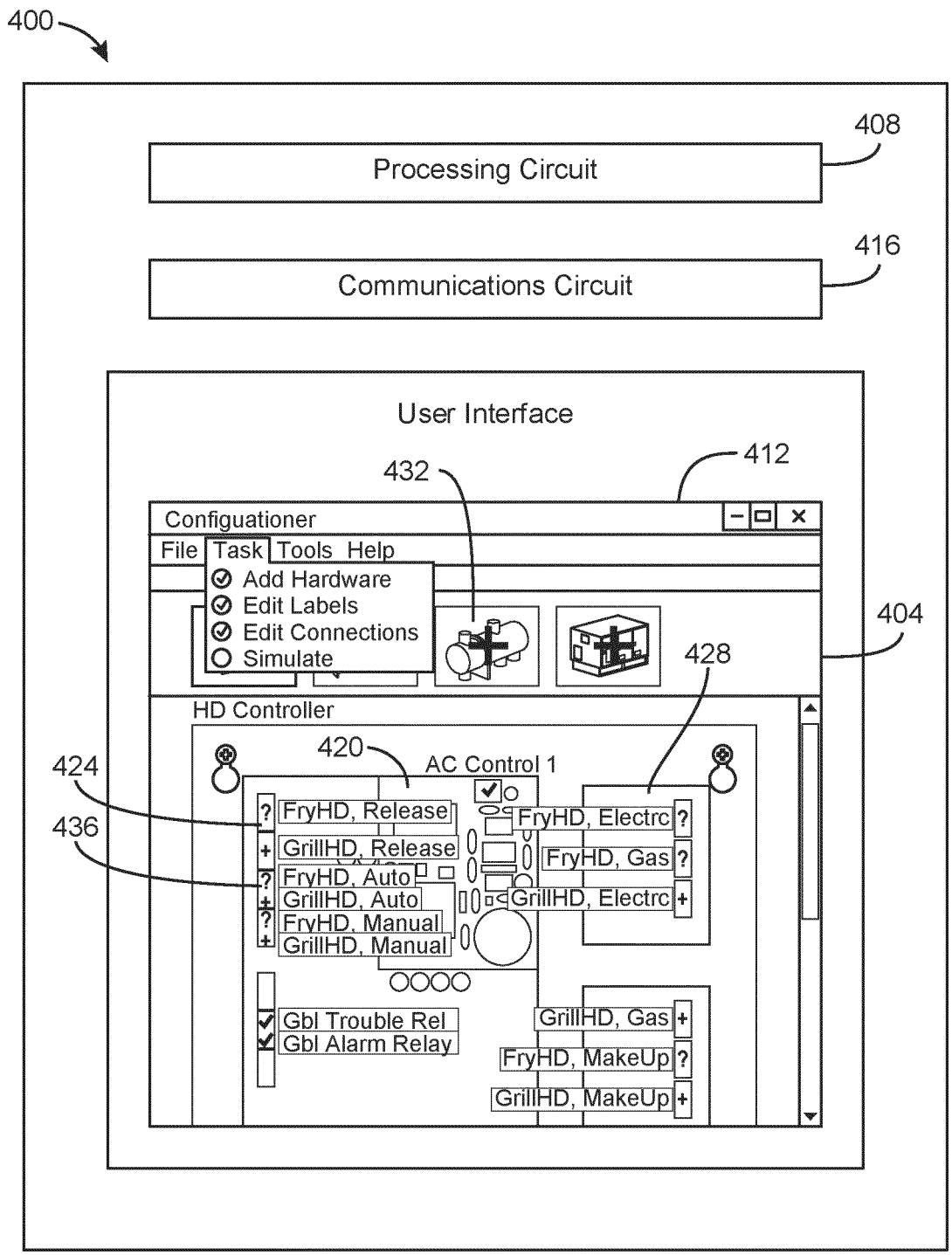
FIG. 4 is a block diagram of a configurator that can be used to configure a fire suppression system.

Referring to FIG. 4, an electronic device 400 can execute a configurator 404. The electronic device 400 can execute the configurator 404 to generate a configuration data structure, which can be provided to the processing circuit 308 of the controller 300 for the controller 300 to use as data of the configuration data structure 324. The electronic device 400 can execute the configurator 404 using a processing circuit 408, which can include a processor and memory similar to the processing circuit 308. The electronic device 400 can include a user interface 412 and a communications circuit 416. The user interface 412 can be used to present the configurator 404 and receive inputs regarding the configurator 404. The user interface 412 can include one or more user input devices, such as buttons, dials, sliders, or keys, to receive input from a user. The user interface 412 may include one or more display devices (e.g., OLED, LED, LCD, CRT displays), speakers, tactile feedback devices, or other output devices to provide information to a user. The communications circuit 416 can include wired or wireless interfaces (e.g., jacks, antennas, transmitters, receivers, transceivers, wire terminals, etc.) for conducting data communications with various systems, devices, or networks. For example, the communications circuit 416 can include an Ethernet card and port for sending and receiving data via an Ethernet-based communications network. The communications circuit 416 can include a Wi-Fi transceiver for communicating via a wireless communications network. The communications circuit 416 can communicate via local area networks (e.g., a building LAN), wide area networks (e.g., the Internet, a cellular network), and/or conduct direct communications (e.g., NFC, Bluetooth). In some embodiments, the communications circuit 416 can conduct wired and/or wireless communications. For example, the communications circuit 416 can include one or more wireless transceivers (e.g., a Wi-Fi transceiver, a Bluetooth transceiver, a NFC transceiver, a cellular transceiver).

The configurator 404 can include a controller representation 420. The controller representation 420 can correspond to the controller 300 described with respect to FIG. 3, including a plurality of input interface representations 424 and a plurality of output interface representations 428. The input interface representations 424 can correspond to input components that would be connected with the controller 300, such as automatic activation systems 150 and manual activation systems 160. The plurality of output interface representations 428 can correspond to output components that would be connected with the controller 300, such as actuators 130 and relays 224.

The configurator 404 can include a plurality of component representations 432. The component representations 432 can correspond to components that may have fire protection, such as hoods 204, fire sources 212, ducts 216, and PCUs 220. For example, FIG. 4 depicts two hood representations 432, a duct representation 432, and a PCU representation 432.

The processing circuit 408 can execute the configurator 404 to present information via the user interface 412 and receive user inputs via the user interface 412. The processing circuit 408 can execute the configurator 404 to generate and update the configuration data that is provided to the processing circuit 308 in order for the processing circuit 308 to maintain and update the configuration data structure 324.

The configurator 404 can present a prompt requesting one or more component representations 432. For example, the configurator 404 can present a prompt identifying options for adding representations 432 of hoods 204, ducts 216, and PCUs 220 to the configuration data. Similarly, the configuration 404 can present a prompt requesting one or more input interface representations 424 and output interface representations 428. The configurator 404 can present prompts requesting associations between the representations 424, 428, 432. For example, the configurator 404 can request an indication of a hierarchy amongst the components associated with the representations 424, 428, 432. The configurator 404 can request a number of various components, devices, and hazards, and use the information received responsive to the request to generate the representations 424, 428, 432.

The configurator 404 can update the configuration data based on the information received via the user interface 412 responsive to the presented prompts. For example, the configurator 404 can receive responses indicating representations 424 of inputs, representations 428 of outputs, and representations 432 of components that will be used in the system, and update a component data structure of the configuration data based on the received responses. The configurator 404 can use a received indication of a hierarchical relationship (e.g., a hood is connected with a duct, which is connected with a PCU), and update a relationship data structure of the configuration data based on the received indication.

The configurator 404 can determine an output response of each output device corresponding to each representation 428. For example, the configurator 404 can maintain various rules, policies, or heuristics that correspond to the response of each output device. The configurator 404 can determine the output response based on the components (corresponding to representations 432) and input devices (corresponding to representations 424) associated with the output device of the representation 428. For example, the configurator 404 can retrieve, from the configuration data (updated based on responses received via the user interface 412), an indication that a first input device of a first input interface representation 424 is assigned to a first component of a first component representation 432, such as if the first input device is an automatic activation system that is used to protect a hood of the first component. The configurator 404 can determine the output response of the output device based on the output device being an actuator 130 or relay 224 that is assigned to activate responsive to a fire condition or supervisory condition corresponding to the first input device and the first component. For example, if the first component representation 432 corresponds to a hood, and the first input interface representation 424 corresponds to an automatic activation system (which would indicate a fire condition), the configurator 404 can determine the output response of the actuator corresponding to the first output representation 428 to be to activate to cause a fire suppression agent to be dispensed to address the fire of the fire condition.

The configurator 404 can present a status label 436 indicating a status of the corresponding representation 424, 428, 432. The status label 436 can indicate a status of the device corresponding to the representation. If the representation is the input interface representation 424 or output interface representation 428, the status label 436 can indicate the status based on whether the device has been assigned to a corresponding component of a component representation 432 (e.g., check mark if assigned to the component).

The configurator 404 can execute a simulation using the configuration data. By executing the simulation, the configurator 404 can enable a user to verify proper system configuration without relying on physical tests. The configurator 404 can execute the simulation responsive to receiving a request via the user interface 412 to execute the simulation. The configurator 404 can execute the simulation to include at least one of a fire detection condition simulation or a supervisory condition simulation. The configurator 404 can present a prompt requesting an input of a type of simulation, receive the input, parse the input to determine if the input indicates the fire condition or supervisory condition, and select the type of simulation based on the determination.

While executing the simulation, the configurator 404 can receive an indication of a component (e.g., hazard) in the fire condition or supervisory condition. For example, the configurator 404 can present a prompt requesting an input indicating the component that is in the fire condition or supervisory condition, such as a particular representation 432. Responsive to receiving the indication of which component is in the fire condition, the configurator 404 can retrieve, from the configuration data, one or more automatic activation systems that are associated with the component in the fire condition or supervisory condition, such as being connected with the component or being higher in the hierarchy and connected with the component. The configurator 404 can cause each of the retrieved automatic activation systems to present a status label 436 indicating that the retrieved automatic activation systems have activated. As such, if an automatic activation system should have activated responsive to the fire condition or supervisory condition of the component, but the simulation executed by the configurator 404 does not present the appropriate status label, the configurator 404 can indicate to a user that the automatic activation system has not been properly configured, such as by not being properly associated with the component. The configurator 404 can receive an input indicating activation of a manual activation system, such as a pull station, and present a status label 436 indicating activation of the manual pull station.

Responsive to retrieving automatic activation systems or manual activation systems that activate based on the fire condition or supervisory condition (e.g., automatically or response to an input indicating activation of the system, such as an input indicating a pull station being pulled), the configurator 404 can determine, based on the configuration data, the output responses corresponding with output devices associated with the automatic activation systems or manual activation systems. For example, the configurator 404 can identify that a particular output device has been defined to have an output response to respond to operation of the automatic activation system or manual activation system, such as an actuator that causes operation of a nozzle to dispense fire suppression agent to address the fire condition, or a relay that causes a gas valve to close responsive to the fire condition or supervisory condition. The configurator 404 can present the status label 436 corresponding to the determined configuration data, which can enable a user to determine if the output devices corresponding to the output interface representations have been properly assigned.

Figure 5:
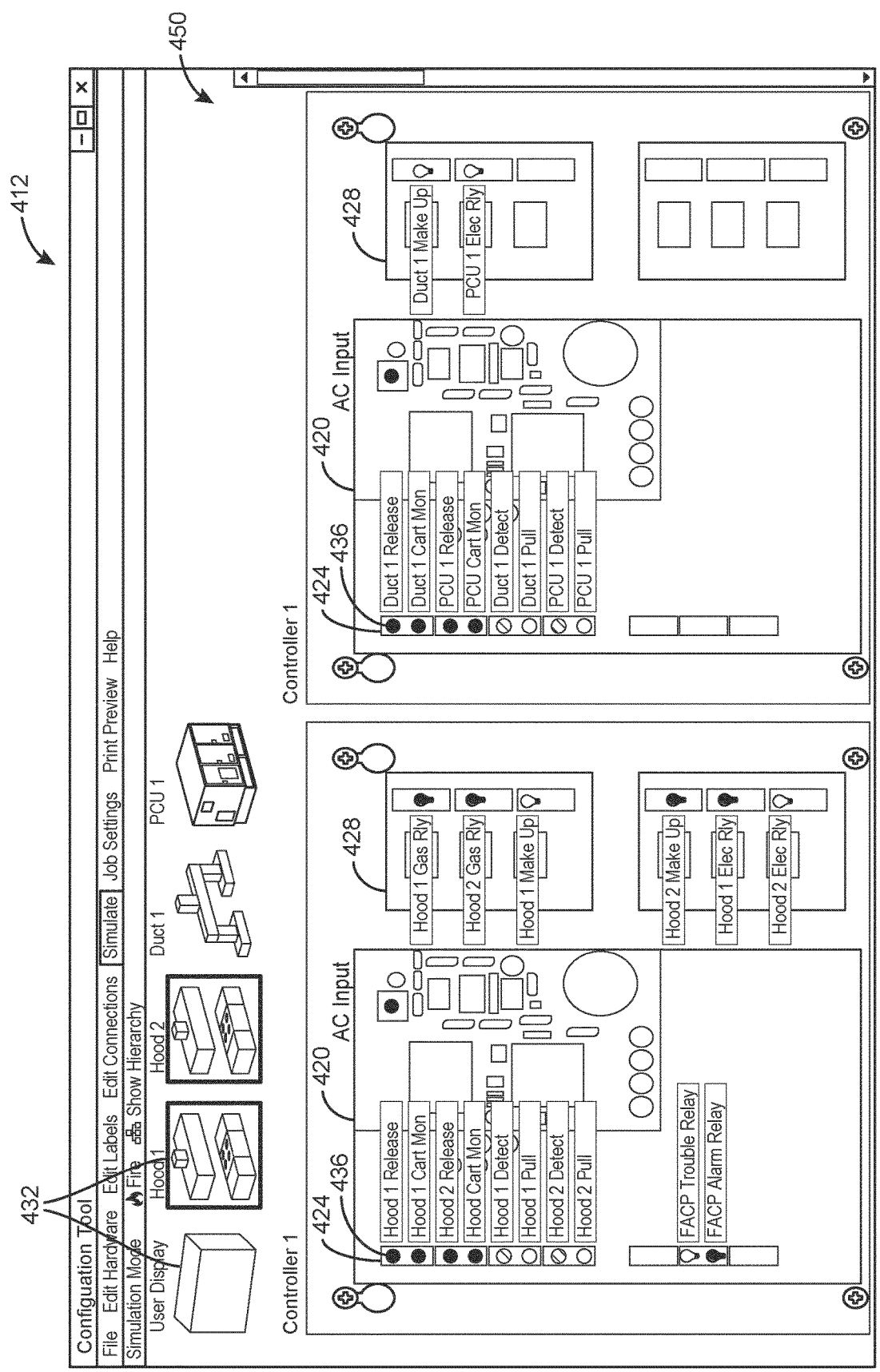
FIG. 5 is an illustration of a user interface.
Figure 6:
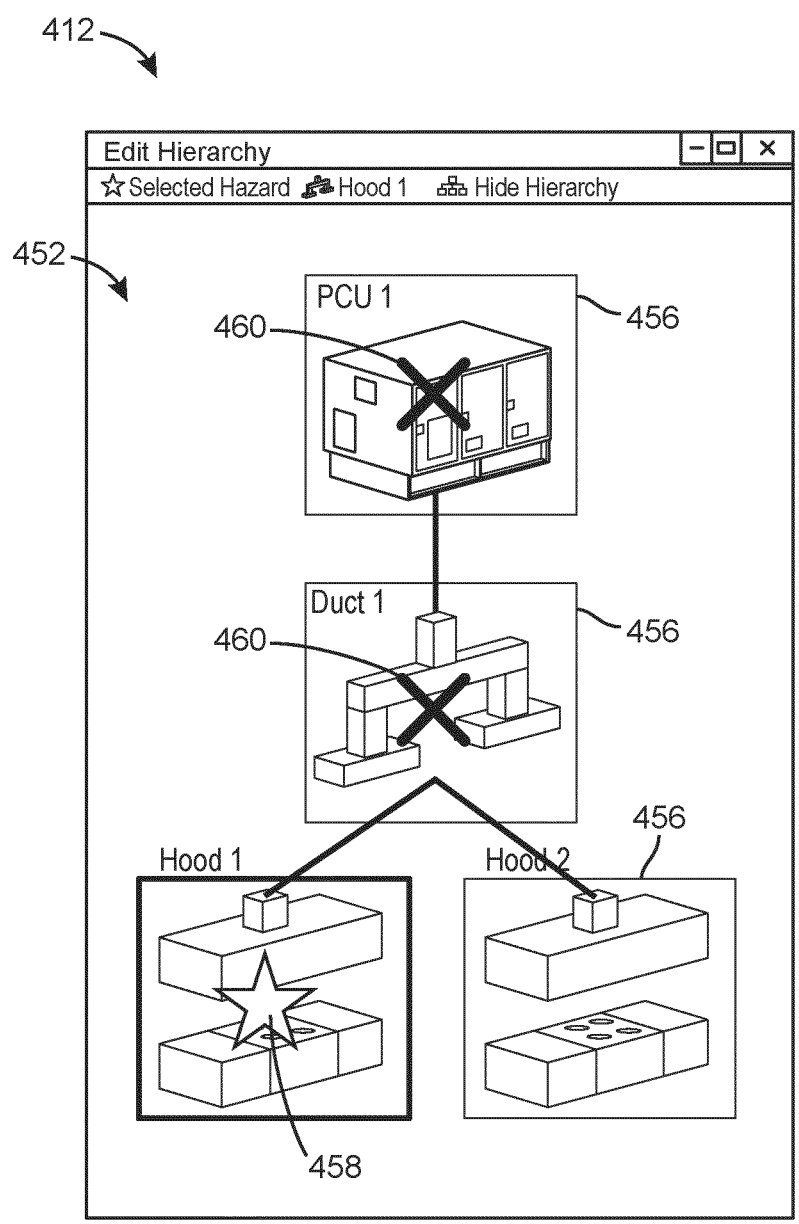
FIG. 6 is an illustration of a hierarchy within a user interface.

Referring to FIGS. 5 and 6, the user interface 412 is depicted in greater detail. FIG. 5 depicts a controller view 450. The controller view 450 includes the controller representation 420 as described above. While in the controller view 450, a user may edit the configuration of a controller (e.g., controller 156, controller 300, etc.). For example, the user may remove, move, or add input connections or output connections of the controller. The controller view 450 may also allow the user to edit or view multiple controllers alongside each other. Each controller may include the plurality of input representations 424, the plurality of output representations 428, and/or the plurality of component representations 432. Each may be editable via the user interface 412. The user may, for example, drag one of the plurality of component representations 432 to one of the plurality of input representations 424 or one of the plurality of output representations 428 to assign the component representation 432 to the input representation 424 or the output representation 428. Each controller may also present status labels 436 for each of the plurality of input representations 424, each of the plurality of output representations 428, and each of the plurality of components representation 432. The status labels 436 may indicate a status, for example, a fire condition being detected, a malfunction, an activation, or another status. The status labels 436 may be a visual or an audio indication, for example, a color or a light, or a beep. The status label 436 may also be a reset indication. The reset indication may be interfaced with (e.g., pressing, etc.) by the user to reset the simulation, the configurator 404, or another component or function. The user may receive a wiring diagram via a mobile device, a print, or another medium to assist when wiring the fire suppression system. The wiring diagram is representative of the inputs and outputs of the controller(s) connected to specific components of the fire suppression system.

A hierarchy representation 452 displayed on the user interface 412 is depicted in FIG. 6. The hierarchy representation 452 may be representative of the controller configuration determined by the user in the controller view 450. The hierarchy representation 452 may be utilized during the simulation as described above. The hierarchy representation 452 includes component representations 456. The component representations 456 may be similar to the plurality of component representations 432. Each of the component representations 456 may represent a component of the fire suppression system (e.g., PCU, duct, hood, controller, etc.). The user may edit, form, or remove connections between components of the fire suppression system via the hierarchy representation 452. The connections between components define a hierarchy of the fire suppression system. The hierarchy determines an order of interaction between the components. For example, a component higher (e.g., upstream, etc.) in the hierarchy will change status in response to a component lower (e.g., downstream, etc.) sensing or simulating a fire condition. The user may edit the hierarchy via the hierarchy representation 452. The editing may be done, for example, via moving the component representations 432 on the user interface 412.

A fire condition may be represented by a hazard indication 458. The hazard indication 458 may be a visual indication, for example, a color change, or a shape within and/or around the component representation 432. The hazard indication 458 may be displayed in response to a simulation or may be displayed in response to an input by the user. A change in status may be represented by a status indicator 460. The status indicator 460 may be a shape or a color displayed on one or more of the component representations 456. The status indicator 460 may be displayed in response to the hazard indicator 458 displaying. The status indicator 460 may have a different visual appearance than the hazard indicator 458. Functions of the user interface 412 may be performed by the configurator 404. The hierarchy view 452 and/or the controller view 450 may include various text or hyperlinks to allow a user to alter various parts of the corresponding view and components thereof.

Figure 7:
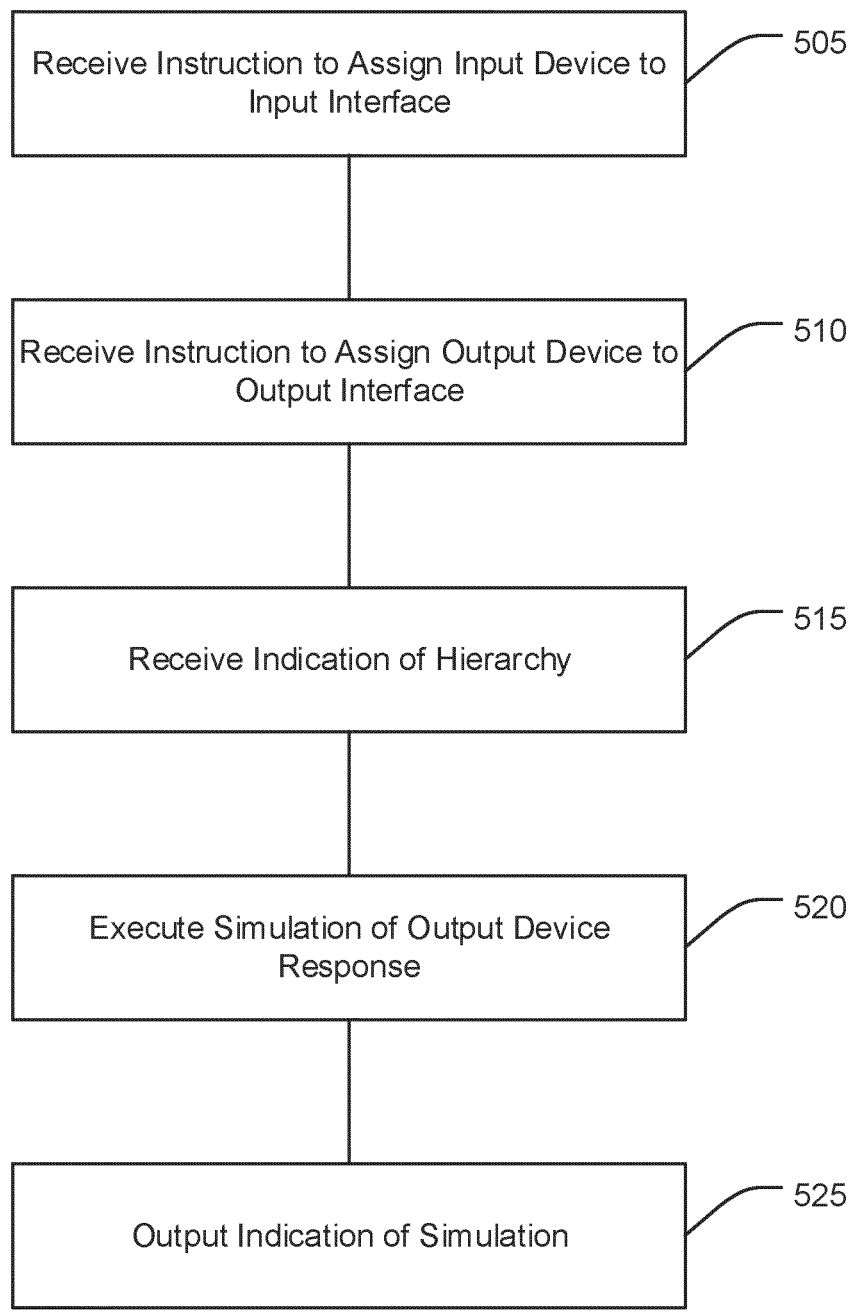
FIG. 7 is a flow diagram of a method of configuring a fire suppression system.

Referring to FIG. 7, a method of simulating a fire suppression system configuration is depicted. The method can be performed using various systems described herein, including the electronic device 400 executing the configurator 404.

At 505, a configurator receives an instruction to assign an input device to an input interface of a fire suppression system controller (e.g., a representation of the fire suppression system controller). The configurator can be executed by a processing circuit of an electronic device. The instruction can be received via a user interface of the electronic device. The user interface can present a representation of the configurator. The configurator can use the user interface to provide prompts requesting information such as the instruction to assign the input device. The input device can include an automatic activation system, such as a temperature-based fire detector, or a manual activation system, such as a pull station. The configurator can receive a plurality of components of the fire suppression system, such as fire hazards, hoods, ducts, and PCUs.

At 510, the configurator receives an instruction to assign an output device to an output interface of the fire suppression system controller. The instruction can be received via the user interface. The output device can include an actuator, such as an actuator that causes a fire suppression agent to be dispensed to address a fire condition, or a relay, such as a relay that causes a gas valve to shut off, an electrical connection to shut off, or an indication of the fire condition to be provided to a building fire alarm panel.

At 515, the configurator receives an indication of a hierarchy of the plurality of components. The hierarchy can indicate certain levels at which each component is located. For example, the indication can indicate that hoods are at lowest level, that ducts are at an intermediate level above the hoods, and that PCUs are at a highest level about the hoods and ducts. The indication can indicate connections between components of the levels, such as an indication that two hoods are connected to a first duct, a third hood is connected to a second duct, and the first and second ducts are connected to a first PCU.

At 520, the configurator executes a simulation of an output response of each output device. For example, the configurator can receive an indication of at least one of a fire condition and a supervisory condition. The configurator can identify each component that each output device is assigned to (e.g., the output device is intended to response to the fire condition or the supervisory condition corresponding to the component). The configurator can identify each input device assigned to each component that each output device is assigned to. Based on the identified input device and component, the configurator can determine the output response of the output device, such as to activate responsive to the fire condition or the supervisory condition that applies to the component. For example, if the output device is an actuator assigned to a hood, and the input device is an automatic activation system that detects the fire condition, the configurator can execute the simulation to include determining the actuator to operate and cause fire suppression agent to be dispensed to address the fire condition of the hood.

The configurator can execute the simulation based on the hierarchy. For example, the configurator can determine that the hood is connected with the first duct and the PCU, and cause each output device assigned to the first duct and the PCU to operate responsive to the fire condition. The configurator can determine the output response for each output device assigned to the second duct to not be to operate responsive to the fire condition of the input device assigned to the hood connected with the first.

At 525, the configurator outputs an indication of the simulation. For example, the configurator can present the simulation via the user interface, allowing a user to determine if the fire suppression system has been properly configured. The configurator may generate configuration data corresponding to the components, input devices, output devices, and output responses, and provide the configuration data to the fire suppression system controller to cause the fire suppressions system controller to be configured.

Having now described some illustrative implementations, it is apparent that the foregoing is illustrative and not limiting, having been presented by way of example. In particular, although many of the examples presented herein involve specific combinations of method acts or system elements, those acts and those elements can be combined in other ways to accomplish the same objectives. Acts, elements and features discussed in connection with one implementation are not intended to be excluded from a similar role in other implementations or implementations.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

Any references to implementations or elements or acts of the systems and methods herein referred to in the singular can also embrace implementations including a plurality of these elements, and any references in plural to any implementation or element or act herein can also embrace implementations including only a single element. References in the singular or plural form are not intended to limit the presently disclosed systems or methods, their components, acts, or elements to single or plural configurations. References to any act or element being based on any information, act or element can include implementations where the act or element is based at least in part on any information, act, or element.

Any implementation disclosed herein can be combined with any other implementation or embodiment, and references to "an implementation," "some implementations," "one implementation" or the like are not necessarily mutually exclusive and are intended to indicate that a particular feature, structure, or characteristic described in connection with the implementation can be included in at least one implementation or embodiment. Such terms as used herein are not necessarily all referring to the same implementation. Any implementation can be combined with any other implementation, inclusively or exclusively, in any manner consistent with the aspects and implementations disclosed herein.

Where technical features in the drawings, detailed description or any claim are followed by reference signs, the reference signs have been included to increase the intelligibility of the drawings, detailed description, and claims. Accordingly, neither the reference signs nor their absence have any limiting effect on the scope of any claim elements.

Systems and methods described herein may be embodied in other specific forms without departing from the characteristics thereof. Further relative parallel, perpendicular, vertical or other positioning or orientation descriptions include variations within +/−10% or +/−10 degrees of pure vertical, parallel or perpendicular positioning. References to "approximately," "about" "substantially" or other terms of degree include variations of +/−10% from the given measurement, unit, or range unless explicitly indicated otherwise. Coupled elements can be electrically, mechanically, or physically coupled with one another directly or with intervening elements. Scope of the systems and methods described herein is thus indicated by the appended claims, rather than the foregoing description, and changes that come within the meaning and range of equivalency of the claims are embraced therein.

The term "coupled" and variations thereof includes the joining of two members directly or indirectly to one another. Such joining may be stationary (e.g., permanent or fixed) or moveable (e.g., removable or releasable). Such joining may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References to "or" can be construed as inclusive so that any terms described using "or" can indicate any of a single, more than one, and all of the described terms. A reference to "at least one of 'A' and 'B'" can include only 'A', only 'B', as well as both 'A' and 'B'. Such references used in conjunction with "comprising" or other open terminology can include additional items.

Modifications of described elements and acts such as variations in sizes, dimensions, structures, shapes and proportions of the various elements, values of parameters, mounting arrangements, use of materials, colors, orientations can occur without materially departing from the teachings and advantages of the subject matter disclosed herein. For example, elements shown as integrally formed can be constructed of multiple parts or elements, the position of elements can be reversed or otherwise varied, and the nature or number of discrete elements or positions can be altered or varied. Other substitutions, modifications, changes and omissions can also be made in the design, operating conditions and arrangement of the disclosed elements and operations without departing from the scope of the present disclosure.

References herein to the positions of elements (e.g., "top," "bottom," "above," "below") are merely used to describe the orientation of various elements in the FIGURES. The orientation of various elements may differ according to other exemplary embodiments, and that such variations are intended to be encompassed by the present disclosure.

What is claimed is:

1. A fire suppression configuration system, comprising:
   one or more processors; and
   memory comprising processor-executable instructions that when executed by the one or more processors, cause the one or more processors to:
      receive, via a user interface, an indication of a plurality of components of a fire suppression system;

receive, via the user interface, an instruction to assign an input device of the fire suppression system to an input interface of a fire suppression system controller of the fire suppression system and to at least one component of the plurality of components;

receive, via the user interface, an instruction to assign an output device of the fire suppression system to an output interface of the fire suppression system controller and to at least one component of the plurality of components;

receive, via the user interface, an indication of a connection between a first component of the plurality of components and a second component of the plurality of components;

determine an output response of each output device by identifying each component that the output device is assigned to and each component that the output device is connected with based on the indication of the connection;

receive an indication of at least one of a fire condition and a supervisory condition corresponding to at least one input device;

execute a simulation by identifying each output response corresponding the at least one of the fire condition and the supervisory condition of the at least one input device; and present a representation of the simulation.

2. The system of claim 1, comprising instructions that cause the one or more processors to:
generate a hierarchy including at least a first level and a second level higher than the first level based on the plurality of components;
use the indication of the connection to map the first component, the second component, and each input device and output device assigned to the first component or the second component to the hierarchy; and
determine the output response, for each output device of a higher level than the input device corresponding to which the indication of the at least one of the fire condition and the supervisory condition is received, to include activation of the output device.

3. The system of claim 1, wherein:
each component corresponds to a potential fire hazard and includes at least one of a hood, a duct, or a pollution control unit (PCU).

4. The system of claim 1, wherein:
each input device includes at least one of an automatic activation system that outputs a first detection signal in response to detecting the at least one of the fire condition and the supervisory condition and a manual activation system that outputs a second detection in response to being activated.

5. The system of claim 1, wherein:
each output device includes at least one of an actuator, a switch, and a relay.

6. The system of claim 1, comprising instructions that cause the one or more processors to:
generate a configuration data representing each component, input device, output device, and output response; and
provide the configuration data to the fire suppression system controller.

7. The system of claim 1, comprising instructions that cause the one or more processors to:
determine the output response to include using the output device to shut off a gas valve or an electrical connection responsive to the indication including at least one of the fire condition and the supervisory condition.

8. The system of claim 1, comprising instructions that cause the one or more processors to:
determine the output response to include using the output device to initiate a fire alarm condition of a building fire alarm panel responsive to the indication including the fire condition.

9. The system of claim 1, comprising instructions that cause the one or more processors to:
determine at least one input device is not assigned to at least one component; and
present a status label indicating that the at least one input device is not assigned to at least one component.

10. A method of simulating a fire suppression system configuration, comprising:
receiving, by one or more processors, an indication of a plurality of components of a fire suppression system;
receiving, by the one or more processors, an instruction to assign an input device of the fire suppression system to an input interface of a fire suppression system controller of the fire suppression system and to at least one component of the plurality of components;
receiving, by the one or more processors, an instruction to assign an output device of the fire suppression system to an output interface of the fire suppression system controller and to at least one component of the plurality of components;
receiving, by the one or more processors, an indication of a connection between a first component of the plurality of components and a second component of the plurality of components;
determining, by the one or more processors, an output response of each output device by identifying each component that the output device is assigned to and each component that the output device is connected with based on the indication of the connection;
receiving, by the one or more processors, an indication of at least one of a fire condition and a supervisory condition corresponding to at least one input device;
executing, by the one or more processors, a simulation by identifying each output response corresponding the at least one of the fire condition and the supervisory condition of the at least one input device; and
outputting, by the one or more processors, a representation of the simulation.

11. The method of claim 10, comprising:
generating, by the one or more processors, a hierarchy including at least a first level and a second level higher than the first level based on the plurality of components;
using, by the one or more processors, the indication of the connection to map the first component, the second component, and each input device and output device assigned to the first component or the second component to the hierarchy; and
determining, by the one or more processors, the output response, for each output device of a higher level than the input device corresponding to which the indication of the at least one of the fire condition and the supervisory condition is received, to include activation of the output device.

12. The method of claim 10, wherein:
each component corresponds to a potential fire hazard and includes at least one of a hood, a duct, or a pollution control unit (PCU).

13. The method of claim 10, wherein:
each input device includes at least one of an automatic activation system that outputs a first detection signal in response to detecting the at least one of the fire condition and the supervisory condition and a manual activation system that outputs a second detection in response to being activated.

14. The method of claim 10, wherein:
each output device includes at least one of an actuator, a switch, and a relay.

15. The method of claim 10, further comprising:
generating, by the one or more processors, a configuration data representing each component, input device, output device, and output response; and
providing, by the one or more processors, the configuration data to the fire suppression system controller.

16. The method of claim 10, further comprising:
determining, by the one or more processors, the output response to include using the output device to shut off a gas valve or an electrical connection responsive to the indication including at least one of the fire condition and the supervisory condition.

17. The method of claim 10, further comprising:
determining, by the one or more processors, the output response to include using the output device to initiate a fire alarm condition of a building fire alarm panel responsive to the indication including the fire condition.

18. The method of claim 10, further comprising:
determining, by the one or more processors, at least one input device is not assigned to at least one component; and
generating, by the one or more processors, a status label indicating that the at least one input device is not assigned to at least one component.

19. A controller for a fire suppression system, comprising:
one or more processors; and
memory comprising processor-executable instructions that when executed by the one or more processors, cause the one or more processors to:
receive, via a user interface, an identification of a plurality of components of the fire suppression system;
receive, via the user interface, a path of connection between the plurality of components of the fire suppression system;
determine a hierarchy of the plurality of components of the fire suppression system representative of the path of connection;
display the hierarchy of the plurality of components of the fire suppression system on the user interface;
execute a simulation representative of a fire condition; and
display the path of connection and the hierarchy in response to the fire condition.

20. The controller of claim 19, wherein
a first component of the plurality of components is simulated to sense the fire condition;
a second component and a third component of the plurality of components are simulated to shut off in response to the fire condition simulated in the first component; and
the second component and the third component are higher in the hierarchy than the first component.

* * * * *